United States Patent [19]

Orban

[11] Patent Number: 4,674,122

[45] Date of Patent: Jun. 16, 1987

[54] ENCODING FOR THE FMX COMPANDING SYSTEM

[75] Inventor: Robert A. Orban, Belmont, Calif.

[73] Assignee: Orban Associates, Inc., San Francisco, Calif.

[21] Appl. No.: 899,148

[22] Filed: Aug. 22, 1986

[51] Int. Cl.⁴ .............................................. H04H 5/00
[52] U.S. Cl. ...................................... 381/13; 381/106
[58] Field of Search ........................ 381/4, 13, 14, 106; 333/14; 332/23 A

[56] References Cited

U.S. PATENT DOCUMENTS

| | | | |
|---|---|---|---|
| 4,208,548 | 6/1980 | Orban | 381/94 |
| 4,602,380 | 7/1986 | Stebbings | 381/13 |
| 4,602,381 | 7/1986 | Cugnini et al. | 381/13 |

*Primary Examiner*—Forester W. Isen
*Attorney, Agent, or Firm*—Blakely, Sokoloff, Taylor & Zafman

[57] ABSTRACT

Improved FMX Companding apparatus for FM transmitter. A pilot subsystem which is substantially identical to the FMX audio path is used to develop a control signal which provides amplitude control through a VCA in the main FMX audio path.

10 Claims, 2 Drawing Figures

ENCODING FOR THE FMX COMPANDING SYSTEM

BACKGROUND OF THE INVENTION

1. Field of the Invention

The field of the invention relates to stereophonic frequency modulation (FM) companding or compression systems.

2. Prior Art

The FMX (TM) companding system is a noise reduction system for FM stereo radio which was developed jointly by Thomas Keller of the National Association of Broadcasters and Emil Torick of CBS Technology Center.

The conventional FM stereo system employs a 38 kHz double-sideband suppressed-carrier AM subchannel to carry the stereo difference signal (L−R). A 19 kHz pilot tone provides a phase reference to regenerate the 38 kHz at the receiver, and also serves to indicate to the receiver that a stereo broadcast is in progress. The subchannel occupies the frequency region from 23 to 53 kHz on the baseband, while the sum (L+R) information occupies the 30–15,000 Hz region to assure compatibility with mono radios. Due to its limited modulation index, the L−R subchannel is far noisier than the main channel. When a receiver is switched from mono to stereo, the received signal becomes 23 to 26 dB noisier.

The FMX system attempts to remove most of this noise by adding a second subchannel in phase quadrature to the existing subchannel. The new "Q" subchannel contains a compressed version of the L−R information, which is also carried in the conventional in-phase "I" subchannel to assure compatibility. The compressed Q channel generally carries a higher level of modulation than does the conventional uncompressed I channel. This fact is exploited to produce noise reduction at the receiver.

The special FMX receiver decodes both the I and Q subchannels. It sums the decoded channels, and applies them to a voltage-controlled amplifier. A servo compares the level at the output of the variable gain amplifier with the level at the output of the I channel alone (which contains the L−R at the correct level and can thus be used as a reference). The servo forces the output of the voltage-controlled amplifier to be at the same level as the I channel alone. Because the Q channel ordinarily contains a higher level of modulation than the I channel, this usually results in the voltage-controlled amplifier's having a gain of less than unity. This reduces any noise picked up by the subchannels. This use of the I channel as a reference for the expander is referred to as "adaptive expansion", and permits the expander to accurately track the Q-channel compressor even if its characteristics (such as compression ratio and attack and release time constants) are varied over a wide range. This is in contrast to a conventional companding system, where accurate reconstruction of the signal requires accurately complementary compressor and expander characteristics.

One compression system has been proposed by CBS/NAB. (See "Improving the Signal-To-Noise Ratio and Coverage of FM Stereophonic Broadcasts" by Emil L. Torick, CBS Technology Center, Stamford, Connecticut, and Thomas B Keller, National Association of Broadcasters, Washington D.C.; *AES Preprint No.* 2119, October, 1984; and "Re-Entrant Compression and Adaptive Expansion For Optimized Noise Reduction", by Gravereaux, Stebbings, Kadin and Cugnini; CBS Technology Center, Stamford, Connecticut, Apr. 10, 1985.) In this system the L−R signal is compressed with an ∞:1 slope, with the compression threshold set at −30 dB (100% modulation = +75 kHz carrier deviation). The input of a voltage-controlled amplifier employed in the compressor is summed out-of-phase with the amplifier's output to achieve a "re-entrant" characteristic. That is, as the L−R modulation approaches 100%, the level in the Q channel approaches 0 to avoid overmodulation of the overall composite baseband signal. Overmodulation avoidance in this system is essentially statistical: the level in the Q channel is reduced whenever there is a high probability that the baseband would otherwise be overmodulated. However, there are still instances which will cause overmodulation. A good example is a high-level source panned slightly left or right to center, such that almost full baseband modulation is produced (assuming no Q channel present), yet the L−R is small (because the L and R signals are almost equal in level). In this case, the CBX compressor can produce modulation of up to 126% when the Q channel is turned on, which violates FCC Rules. Clearly, it is necessary to take steps to control baseband modulation under all soundfield conditions.

While overall modulation of the main channel and I channel could be reduced approximately 2 dB to accommodate such potential overmodulation, this would cause loudness loss (and also cause the signal-to-noise ratio to deteriorate). A limiter could be placed at the composite output of the stereo generator to control modulation, but this would also cause loudness loss and might cause "pumping" or other obvious limiter-induced artifacts. A clipper could be placed at the composite output of the stereo generator, but this would cause increased distortion when it operated, and would also disturb the spectral integrity of the baseband by producing harmonic and intermodulation distortion in the frequency range byond 57 kHz. None of the these solutions to the problem of Q-channel-induced overmodulation is really satisfactory.

The present invention not only completely solves the overmodulation problem, but does so without affecting compatible reception (i.e. conventional receivers without FMX decoding), and while preserving the spectral integrity of the baseband. In essence, it uses a delay-line controller similar in concept to that described in U.S. Pat. No. 4,208,548. That is, a "pilot system" using feedback control is used to derive a control voltage for a voltage-controlled amplifier, the control voltage is delayed and smoothed, and is used to control a second voltage-controlled amplifier whose input is a delayed version of the input of the first voltage-controlled amplifier.

SUMMARY OF THE PRESENT INVENTION

An apparatus is disclosed for providing improved compression or companding in a stereophonic FM broadcast system which receives input audio signals and provides the compression or companding for an L−R signal. The apparatus employs a pilot subsystem which duplicates the I and Q channels in the main FMX signal path. A feedback path feeds the output of a combining means of this subsystem to a VCA in the subsystem. Filtering means are provided in the feedback path to smooth this control signal. This signal is coupled to a second VCA which provides the compression for the L−R signal in the Q channel. The audio signal inputs to the main FMX signal path are delayed when compared to the audio signals applied to the pilot subsystem.

DETAILED DESCRIPTION OF THE INVENTION

An apparatus for providing improved companding or compression in an FM broadcasting system is described. In the following description, numerous specific details are set forth such as specific filters, etc., in order to provide a thorough understanding of the present invention. It will be obvious, however, to one skilled in the art that the present invention may be practiced without these specific details. In other instances, well-known circuits have been shown in block diagram form in order not to obscure the present invention in unnecessary detail.

GENERAL PRIOR ART FMX SYSTEM

Figure 1:
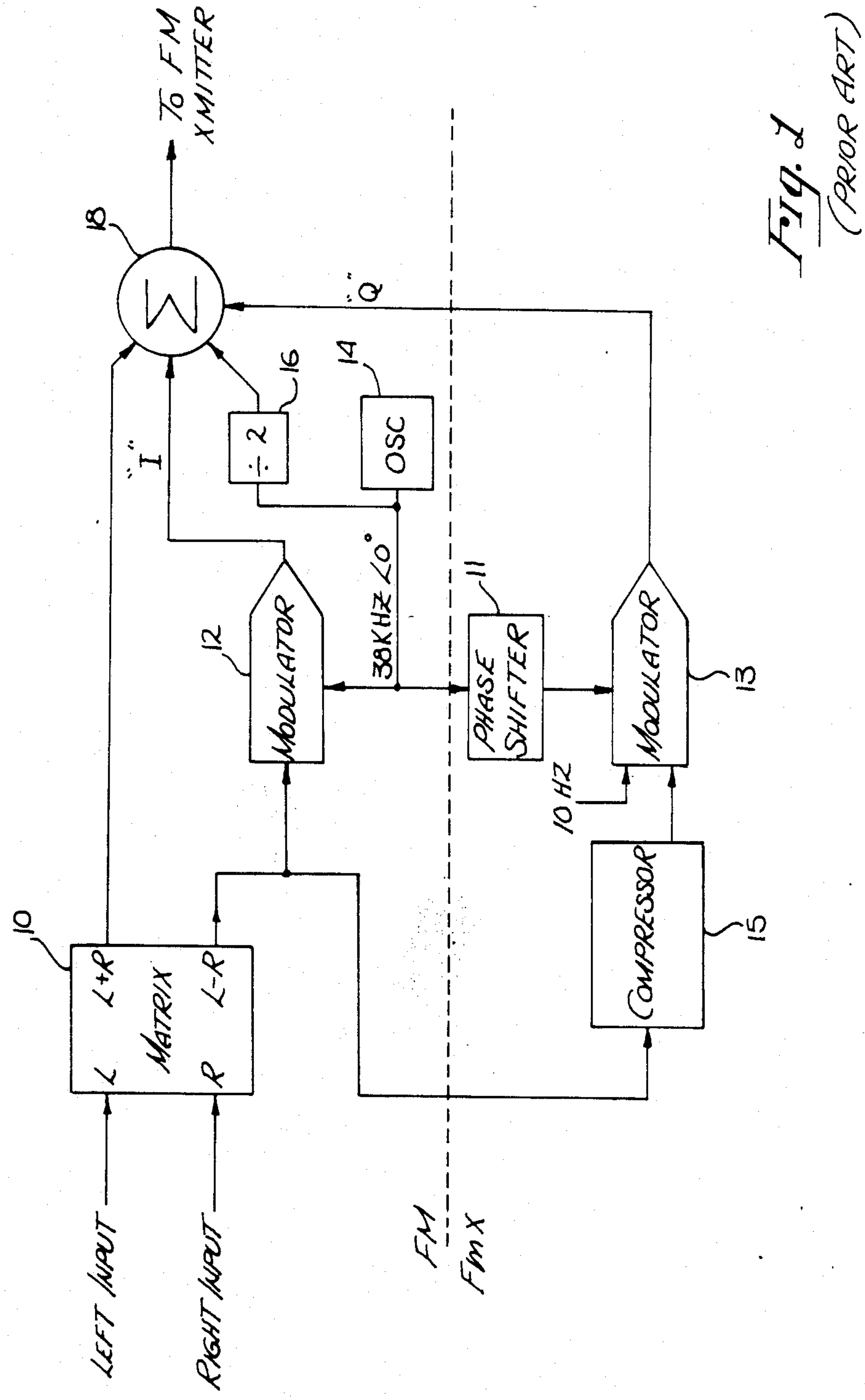
FIG. 1 is a block diagram showing the prior art FMX system with its conventional FM section and a second section for providing companding or compression of the L−R signal.

Referring to FIG. 1, a conventional stereo FM broadcasting system is shown above the dotted line and the with additional circuitry used in the FMX system to provide the Q channel being shown below the dotted line. In the conventional FM system, a matrix 10 receives the left and right audio input signals and provides a L+R and L−R signal. The L+R signal is coupled to a summer 18. The L−R signal is coupled to a modulator and in effect is used to modulate the subcarrier signal of 38 kHz. This provides the conventional I channel at the output of the modulator 12 which is coupled to the summer 18. (The subcarrier frequency is shown provided by an oscillator 14.) The subcarrier signal is divided by two by divider 16 and provides phase information and a pilot tone which is used to indicate the presence of the stereophonic transmission. This tone is also coupled to the summer 18.

For the FMX system, the subcarrier frequency 14 is again used, however, it is first shifted in phase by 90 degrees as indicated by the phase shifter 11. Compression of companding is used in the L−R channel to provide noise reduction as shown by the compressor 15. (For purposes of this application, the words "compression" and "companding" are used interchangeably.) The compressed L−R signal is coupled to the modulator 13 to modulate the phase shift subcarrier signal. The resultant Q channel signal is also coupled to the sumemr 18. A 10 Hz signal is coupled to the modulator 13 and produces a deviation of the main carrier (+and −750 Hz) which is used to indicate the presence of the Q channel.

The present invention provides an improved compression apparatus for use with the FMX system of FIG. 1.

CURRENTLY PREFERRED EMBODIMENT OF THE PRESENT INVENTION

Figure 2:
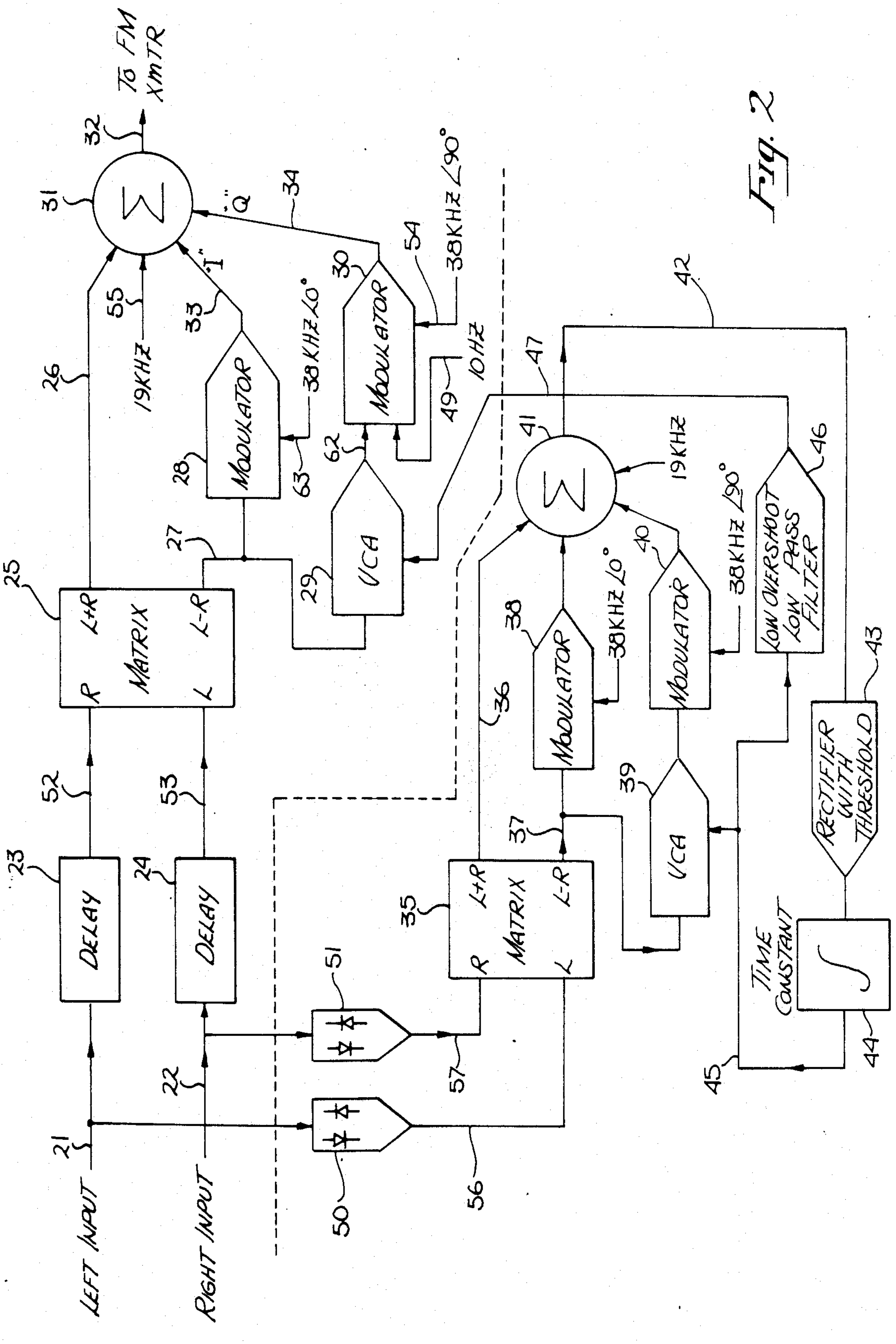
FIG. 2 is a block diagram of the presently preferred embodiment of the invention.

Referring to FIG. 2, a substantially peak-limited and 15 kHz band-limited stereo signal is applied (e.g., from the output of an audio processing system) to lines 20 and 21. These signals are split into two paths, one for the main FMX path, and the other for a pilot subsystem which provides a control signal for the VCA 29 in the main path. The pilot subsystem and VCA 29 provide the compressing represented generally by compressor 15 of FIG. 1.

The main path feeds delay means 23 and 24, which may include overshoot-compensated lowpass filters such as those described in U.S. Pat. No. 4,460,871. The currently preferred delay is 3–5 milliseconds. Such delay may be realized by bucket-brigade devices, charge-coupled devices, or digital delay lines. The outputs of delay means 23 and 24 are very accurately peak-limited and are also tightly bandlimited to less than 19 kHz in the currently preferred embodiment.

The outputs of the delay means 23 and 24 are coupled to the input of matrix 25, which derives the stereophonic sum (L+R) and difference (L−R) signals from the left and right inputs. The L−R output on line 27 is applied to doubly-balanced modulator 28, where it is multiplied by a 38 kHz sinewave whose zero-crossings coincide with the zero-crossings of the 19 kHz pilot tone on line 55. The produce appearing on line 33 is the conventional I stereophonic subchannel.

The L−R signal on line 27 is also coupled to the input of voltage-controlled amplifier (VCA) 29, which has been equalized so that its time delay is negligible in the frequency range of 30–19,000 Hz. The output of VCA 29 is coupled to the input of doubly-balanced modulator 30. A small amount of 10 Hz sinewave is also coupled to the input of modulator 30 (line 49). This 10 Hz signal serves as a pilot tone to indicate that the FMX (Q) subchannel is being broadcast, and produces deviation ( (+and −) of the main carrier. The sum of the signals on lines 49 and 62 are multiplied by a 38 kHz sinewave (line 54) whose phase leads the 38 kHz sinewave on line 63 by 90 degrees within modulator 30, thus producing the Q subchannel.

The L+R signal on line 26 is summed within summer 31 with the I (line 33) and Q (line 34) subchannel and with the 19 kHz pilot tone (line 55) to produce the composite output on line 32. Line 32 feeds the FM transmitter.

The audio inputs on lines 21 and 22 are also applied to clippers 50 and 51, respectively on the pilot subsystem to assure that the peak levels on lines 56 and 57 are constrained to be the same as the peak levels on lines 52 and 53. (Note that delay means 23 and 24 are assumed to have unity gain, and may contain clippers and/or overshoot compensation means.) The peak-controlled signals on lines 56 and 57 are applied to matrix 35 to derive the stereophonic sum and difference signals. The outputs of matrix 35 are coupled to elements similar to the elements in the above-described main FMX path to produce a composite output on line 42 which is proportional in peak level to the composite signal on line 32, but which occurs earlier because its input signals have not been passed through delay means 23 and 24. This pilot subsystem comprises the modulator 38 (corresponding to modulator 28), VCA 39 (corresponding to VCA 29) modulator 40 (corresponding to modulator 30) and the summer 41 (corresponding to summer 31).

The composite signal on line 42 is applied to rectifier-with-threshold 43 and time constant integrator network 44. These elements may be realized as shown in FIG. 3 of U.S. Pat. No. 4,249,042, although other realizations are also possible.

The output of time-constant network 44 is applied to VCA 39, closing a feedback loop. The loop is used to keep the peak level on line 42 constant (at the threshold of rectifier 43) by adjusting the gain of VCA 39 and thus the amount of modulation in the Q subchannel.

In the currently preferred embodiment, network 44 is arranged to have a very fast attack time (preferably less than 10 microseconds), a hold time (before release commences) of approximately 50 milliseconds, and a release time of approximately 100 milliseconds. The fast attack time assures that the control voltage will rise to the level necessary to completely eliminate any overshoots at line 32 (as will be explained below). The hold time avoids release on each cycle of a low-frequency signal, avoiding the distortion which would otherwise occur. The hold time also permits the output of lowpass filter 46 to rise to the full level necessary to avoid overshoots at line 42. The recovery time matches the "temporal masking" characteristics of the human ear; the ear takes about 100 ms to recover to full sensitivity for low amplitude sounds after a high-amplitude sound occurs.

The characteristics of VCA 39 are preferably precisely matched to those of VCA 29. When the level on line 42 is below threshold, VCA 39 has a constant gain (20 dB in the currently preferred embodiment). The control voltage for VCA 39 on line 45 is applied to lowpass filter 46. In the currently preferred embodiment, this filter is a third-order all-pole filter with a parabolic distribution of poles. (See S.K. Mulick, "Pulse Networks with Parabolic Distribution of Poles" , IRE Trans. Circuit Theory, vol. CT-9, pp. 302–205, September, 1961.) This filter overshoots less than 2%. Its frequency cutoff in scaled to produce a risetime which is slightly less than the delay means 23 and 24. (In this special case, risetime is defined unconventionally as the time necessary for the voltage at the output of filter 46 to rise from 0% to 100% of the value of a step applied to the input of the filter. Because the filter 46 overshoots to approximately 102%, this time is well-defined.) This assures that the control voltage applied to line 47 has achieved its full value before the signal requiring the control voltage arrives at lines 52 and 53. In this way, no overshoots are produced on line 32 and accurate modulation control is achieved. Because the transitions on the control voltage line 47 have been greatly slowed and smoothed by lowpass filter 46, audible modulation distortion (perceived as "clicks" and "pops" in the audio due to modulation of the audio by abruptly-changing control voltages) is avoided. In addition, the changes in the envelope of the Q channel signal are rendered slow enough to be followed by the "adaptive expander" in the receiver without difficulty. This would not be the case if the control voltage were not smoothed by filter 46.

CURRENTLY PREFERRED IMPLEMENTATION OF THE MODULATORS

Modern stereo generators usually use well-known switching technique to perform the doubly-balanced function of modulators 28, 30, 38 and 40. The highest performance designs either use multiplying Digital-To-Analog Converters (M-DAC's) or several digitally-operated analog switches connected in parallel. The switches are driven with pulse trains which are chosen such that when the outputs of the switches are summed, lower harmonics of 38 kHz (and sidebands thereof caused by the modulation process) are cancelled. Because higher-order harmonics are not cancelled, a constant-delay lowpass filter is ordinarily inserted in series with line 32 to suppress such high-order components.

Such a filter is unnecessary in line 42 because the relative summation gains of the components providing the signals to summer 41 can be chosen so that the peak level on line 42 is directly proportional to the peak level on line 36 after lowpass filtering. In fact, placing a filter in series with line 42 is not practical because its delay may destablize the feedback loop unless its attack time is made too lond to achieve accurate control of the peak level of the composite signal.

The currently preferred emboidment uses these well-known switching techniques embodied in the modulators to generate the signals on both lines 32 and 42. An appropriate lowpass filter is placed in series with line 32. No filter is used in line 42. The fact that the high-order harmonics are not eliminated from line 42 is accurately compensated by appropriate adjustment of the summation gain of the signal on line 36, such that the peak level on line 42 is always proportional to the peak level on line 32 after filtering.

CONTROL OF NOISE MODULATION

The threshold of rectifier 43 (with reference to the modulation level produced when the Q channel is turned off) can be important in controlling noise modulation effects. These effects occur in any noise reduction system which uses companding, because variations in the gain of the expander also change the noise level at the expander output. The goal in any noise reduction system is to assure that the noise is always masked by the signal whenever expander gain changes occur, rendering any such change undetectable to the ear and resulting in a subjectively constant noise floor.

The FMX system is particularly subject to noise modulation effects because, when the level of the conventional stereo components (i.e., the sum of the L+R, the I channel, and the 19 kHz pilot tone) is close to 100%, the "reentrant" characteristic causes abrupt changes in the gain of the Q channel with relatively small changes in input level. It is easily seen that, if the threshold of rectifier 43 is set at the 100% modulation point (with reference to ordinary stereo without the Q channel), the system disclosed herein will force the modulation of the Q channel to 0 whenever clippers 50 and 51 are active, indicating 100% modulation of the ordinary stereo component of the signal. In this case, there is simply no room on the composite for addition of any further level whatever—including the Q channel. Whenever the Q channel is forced off, no noise reduction is produced, and noise modulation effects are most likely to be audible at the receiver.

The situation rapidly improves if the threshold of rectifier 43 is set higher than the nominal 100% point of the conventional stereo components. This 100% point is very tightly-controlled because of effective peak limiting in delay means 23 and 24 (and the simulation of such limiting in clippers 50 and 51 in the pilot control subsystem). Thus any increase in the threshold of rectifier 43 beyond 100% will assure that Q channel cutoff can never occur; some Q channel modulation is in fact required to increase the composite- peak level on line 42 to the above-100% threshold point.

However, there is a tradeoff; loudness and signal-to-noise ratio on conventional (non-FMX) receivers will be reduced in proportion to the threshold increase because the peak modulation of the total composite must still be constrained to +and −75 kHz deviation. This must be achieved by attenuating the overall level on line 32 such that the peak deviation of the transmitter is limited to +and −75 kHz.

The situation with an FMX receiver is different, because large improvements in subjective noise performance may be achieved with a relatively small reduction in loudness, achieving substantially improved signal-to-noise ratio. The amount of improvement is highly dependent upon the L+R/L−R ratio of the source materials; the greatest improvement is achieved when this ratio is high and relatively little L−R energy exists in the original source material.

It is thus advisable to provide the user with a control to vary the threshold of rectifier 43 with reference to 100% modulation of the conventional stereo composite. This can be achieved directly by varying the threshold of rectifier 43 (forcing the user to attenuate the level on line 32 to compensate for the increased composite level) or indirectly by inserting tracking attenuators in lines 52, 53, 56 and 57, thus reducing the peak modulation produced by the conventional stereo composite. The indirect method, although more complex to implement, is preferred because no adjustment of the composite level at line 32 is required, and the user can immediately assess the tradeoff between noise modulation and loudness without any need to readjust composite gain.

COMPARISON WITH THE SYSTEM DISCLOSED BY CBS AND NAB

The currently preferred embodiment described above operates by always achieving maximum modulation of the Q channel within the constraints that legally, peak modulation of the entire composite must be limited to +and −75 kHz or less. This always achieves the maximum noise reduction theoretically available. Attempts to achieve any more noise reduction (by further increasing the level of the Q channel) result in overmodulation of the composite signal. No approximations are necessary because the system uses the actual composite- level as its references, instead of the L−R level (as does the CBS/NAB system). By use of a delay line, overshoots are avoided for all program material and all sound fields, and the envelope changes sufficiently slowly to permit accurate decoding of the signal by the adaptive expander in the FMX receiver.

The "reentrant" characteristic discussed in the CBS/NAB paper is achieved automatically by this system. However, instead of being fixed as a function of the L−R level, it adapts automatically to the program material in order to always achieve the maximum available noise reduction. In general, if one examines the output level of VCA 29 as a function of its input, a negative compression ratio for L−R is produced by the system; the threshold of compression will adapt to the program material, and will almost always be substantially higher than with the CBS/NAB system (achieving full 20dB noise reduction for a greater proportion of time). When threshold is finally reached, the output of VCA 29 will then tend to decrease as the L−R level at the input of VCA 29 increases above the threshold.

Thus, an improved compression apparatus has been described for use with an FMX system which overcomes a number of the problems associated with the prior art CBS/NAB system.

I claim:

1. An FM stereophonic broadcasting system comprising:

a first section for receiving L and R audio signals and for providing a first combined signal comprising L+R and a subcarrier modulated by L−R;

a Q section for providing a second combined signal comprising said subcarrier shifted in phase and modulated by a compressed L−R signal, said compression being controlled by a first control signal;

pilot subsystem comprising a pilot first section substantially similar to said first section coupled to receive said L and R audio signals and a pilot Q section substantially similar to said Q section for providing a third combined signal;

filtering means for filtering said third combined signal to provide said first control signal for said compression in said Q section; and, delay means for delaying said L and R audio signals coupled to said first section such that said audio signals are first received by said pilot subsystem, said delay means being coupled to said first section;

whereby compression in said Q channel is achieved.

2. The system defined by claim 1 wherein said filtering means comprises a lowpass filter.

3. The system defined by claim 2 including a rectifier with a threshold for rectifying said third combined signal to provide a second control signal.

4. The system defined by claim 3 wherein said Q section includes a first voltage controlled amplifier which is controlled by said first control signal, and wherein said pilot subsystem includes a second voltage controlled amplifier controlled by said second control signal.

5. The system defined by claim 4 including clipping means for limiting the amplitude of said L and R audio signals coupled to said audio subsystem.

6. In a stereophonic FM braodcasting system which receives audio input signals and includes a first section having an L+R signal and a subcarrier signal modulated with an L−R signal, and a second section for compressing an L−R signal, an apparatus for providing improved compression for said second L−R signal comprising:

a pilot subsystem comprising:

(1) first voltage controlled amplifier (VCA) coupled to receive said L−R signal:

(2) a first modulator for modulating said subcarrier signal with said L−R signal;

(3) a second modulator for modulating said subcarrier shifted in phase with the output signal of said first VCA;

(4) combining means for combining said L+R signal with the output of said first and second modulators;

(5) a feedback path coupling the output of said combining means to said first VCA;

(6) filtering means for filtering said output of said combining means to provide a control signal;

a second VCA for providing said compression for said L−R signal in said second section, said second VCA coupled to receive said control signal; and, delaying means for delaying said audio input signals coupled to said first and second sections;

whereby compression is provided.

7. The apparatus defined by claim 6 wherein said filtering means comprises a lowpass filter.

8. The apparatus defined by claim 7 wherein said output of said combining means is coupled to a rectifier having a threshold level.

9. The apparatus defined by claim 8 wherein said threshold level is controllable.

10. The apparatus defined by claim 8 wherein the levels of said audio input signals applied to said first and second sections, and the levels of said audio input signals applied to said pilot subsystem are controllable.

* * * * *

UNITED STATES PATENT AND TRADEMARK OFFICE
CERTIFICATE OF CORRECTION

PATENT NO. : 4,674,122

DATED : 6-16-87

INVENTOR(S) : Orban

It is certified that error appears in the above-identified patent and that said Letters Patent is hereby corrected as shown below:

| Column | Line | Correction |
|---|---|---|
| 3 | 54 | delete "sumemr", insert --summer-- |
| 6 | 8 | delete "lond", insert --long-- |
| 8 | 31 | delete "braodcasting", insert --broadcasting-- |

Signed and Sealed this

Twenty-ninth Day of August, 1989

*Attest:*

DONALD J. QUIGG

*Attesting Officer*

*Commissioner of Patents and Trademarks*